(12) United States Patent
Bae (10) Patent No.: US 12,323,157 B2
(45) Date of Patent: Jun. 3, 2025

(54) ADC ERROR COMPENSATION CONTROL DEVICE AND CONTROL METHOD THEREFOR

(71) Applicant: HL MANDO CORPORATION, Pyeongtaek-si (KR)

(72) Inventor: Kyeungcheol Bae, Seoul (KR)

(73) Assignee: HL MANDO CORPORATION, Pyeongtaek-si (KR)

( * ) Notice: Subject to any disclaimer, the term of this patent is extended or adjusted under 35 U.S.C. 154(b) by 269 days.

(21) Appl. No.: 18/129,361

(22) Filed: Mar. 31, 2023

(65) Prior Publication Data
US 2024/0187011 A1 Jun. 6, 2024

(30) Foreign Application Priority Data
Dec. 2, 2022 (KR) .................. 10-2022-0166689

(51) Int. Cl.
  *H03M 1/06* (2006.01)
  *H03M 1/10* (2006.01)
  *H03M 1/12* (2006.01)
  *H03M 1/38* (2006.01)

(52) U.S. Cl.
  CPC .......... *H03M 1/0604* (2013.01); *H03M 1/10* (2013.01); *H03M 1/1023* (2013.01); *H03M 1/12* (2013.01); *H03M 1/121* (2013.01); *H03M 1/38* (2013.01)

(58) Field of Classification Search
  CPC ........ H03M 1/0604; H03M 1/10; H03M 1/12; H03M 1/1023; H03M 1/121; H03M 1/38
  USPC .................................................. 341/118, 155
  See application file for complete search history.

(56) References Cited

U.S. PATENT DOCUMENTS

| | | | | |
|---|---|---|---|---|
| 6,433,712 B1* | 8/2002 | Ohnhaeuser | ........ | H03M 1/1019 341/118 |
| 8,736,468 B2* | 5/2014 | Fabregas | ................. | H03M 1/12 341/118 |

FOREIGN PATENT DOCUMENTS

| | | |
|---|---|---|
| JP | 2007-78465 A | 3/2007 |
| KR | 10-1471611 B1 | 12/2014 |

OTHER PUBLICATIONS

Office Action issued on Jul. 5, 2024 for corresponding Korean Patent Application No. 10-2022-0166689 along with an English machine translation (9 pages).

* cited by examiner

*Primary Examiner* — Khai M Nguyen
(74) *Attorney, Agent, or Firm* — Hauptman Ham, LLP (57) ABSTRACT

An ADC error compensation control device according to an embodiment of the present invention includes an ADC module configured to calculate a first result value using a sensed input voltage $V_{in}$ and an input reference voltage $V_{ref}$, and calculate a second result value using an input MCU supply voltage and the input reference voltage $V_{ref}$, an error compensation unit configured to calculate an error compensation value on the basis of the second result value calculated by the ADC module, the MCU supply voltage, and a steady state value of the reference voltage $V_{ref}$, and a logic unit configured to perform conversion to a real value on the basis of the first result value and the error compensation value.

16 Claims, 6 Drawing Sheets

| 12 bit ADC | 4095 |
| Reference voltage | 5V |

| Input | 200 | 250 | 300 | 350 | 400 | 450 | 500 |
|---|---|---|---|---|---|---|---|
| Sensor output | 2 | 2.5 | 3 | 3.5 | 4 | 4.5 | 5 |
| ADC Result | 1638 | 2047 | 2457 | 2866 | 3276 | 3685 | 4095 |
| Real Value | 200.00 | 249.94 | 300.00 | 349.94 | 400.00 | 449.94 | 500.00 |
| Error | 0.00 | 0.06 | 0.00 | 0.06 | 0.00 | 0.06 | 0.00 |
| Error(Vref 5V) | 0.00% | 0.02% | 0.00% | 0.02% | 0.00% | 0.01% | 0.00% |

| 12 bit ADC | 4095 |
| Reference voltage | 5V |
| Error | 1% |
| Reference voltage (error is reflected) | 4.95 V |

| Input | 200 | 250 | 300 | 350 | 400 | 450 | 500 |
|---|---|---|---|---|---|---|---|
| Sensor output | 2 | 2.5 | 3 | 3.5 | 4 | 4.5 | 5 |
| ADC Result | 1654 | 2068 | 2481 | 2895 | 3309 | 3722 | 4136 |
| Real Value | 201.95 | 252.50 | 302.93 | 353.48 | 404.03 | 454.46 | 505.01 |
| Error | -1.95 | -2.50 | -2.93 | -3.48 | -4.03 | -4.46 | -5.01 |
| Error(Vref 4.95V) | -0.98% | -1.00% | -0.98% | -0.99% | -1.01% | -0.99% | -1.00% |

| | | |
|---|---|---|
| 12 bit ADC | 4095 | |
| Reference voltage | 5V | |
| Error | 1% | |
| Reference voltage (error is reflected) | 4.95 V | |
| VDD | 3.3V | |
| ADC Result (Reference) | 2702 | |
| ADC Result (Compensation) | 2730 | |
| Compensation value | -28 | |

| Input | 200 | 250 | 300 | 350 | 400 | 450 | 500 |
|---|---|---|---|---|---|---|---|
| Sensor output | 2 | 2.5 | 3 | 3.5 | 4 | 4.5 | 5 |
| ADC Result | 1654 | 2068 | 2481 | 2895 | 3309 | 3722 | 4136 |
| Real Value | 201.95 | 252.50 | 302.93 | 353.48 | 404.03 | 454.46 | 505.01 |
| Error | -1.95 | -2.50 | -2.93 | -3.48 | -4.03 | -4.46 | -5.01 |
| Error(Vref 4.95V) | -0.98% | -1.00% | -0.98% | -0.99% | -1.01% | -0.99% | -1.00% |
| Compensation ADC Result | 1626 | 2040 | 2453 | 2867 | 3281 | 3694 | 4108 |
| Compensation Real Value | 198.535 | 249.0842 | 299.5116 | 350.0611 | 400.6105 | 451.0379 | 501.5873 |
| Error | 1.4652 | 0.915751 | 0.4884 | -0.06105 | -0.6105 | -1.03785 | -1.5873 |
| Error (compensation logic) | 0.73% | 0.37% | 0.16% | -0.02% | -0.15% | -0.23% | -0.32% |

ADC ERROR COMPENSATION CONTROL DEVICE AND CONTROL METHOD THEREFOR

TECHNICAL FIELD

The present invention relates to an ADC error compensation control device and a control method therefor, and more particularly, to an ADC error compensation control device and a control method therefor capable of correcting a sensing voltage error using a VDD or Vcore voltage, which is a supply voltage of an MCU, to reduce a sensing error even when an error occurs in an ADC reference voltage.

BACKGROUND

In recent years, electric vehicles have a large and complex electronic control system, and securing reliability and stability of the electronic control system has emerged as an important issue, unlike internal combustion locomotives. In order to secure the reliability and stability of the electronic control system, accurate sensor information is essential, and a high-voltage converter (inverter) in an eco-friendly vehicle also uses several sensors to secure reliability and stability. However, a large error occurs in the sensors and unintended control causes a fire in a converter system or the like, which acts as a major threat to the safety of users.

In order to solve this problem, when a voltage and current input to the converter are sensed, the voltage and current are sensed through an ADC module.

Examples of analog-to-digital converters (ADCs) broadly includes an oversampling ADC that exhibits a higher sampling rate compared to a bandwidth of an input analog signal, a Nyquist ADC that exhibits a higher sampling rate than a Nyquist sampling rate compared to a bandwidth of an input analog signal, and pipeline, flash, and SAR type ADCs that exhibit a Nyquist sampling rate.

Since the flash type ADC generally includes a comparator for each reference comparison point, power consumption and an occupying area on a chip increase rapidly as resolution increases. Further, the pipeline type ADC includes an operational amplifier that amplifies a residue that exists after comparison in each stage, and power consumption is high because constant current flows through the amplifier.

In order to compensate for a disadvantage of high power consumption, a successive approximation register (SAR) type ADC has recently been in the spotlight, and many related studies are being conducted.

SUMMARY

An object of the present invention is to provide an ADC error compensation control device and a control method therefor, and more particularly, to an ADC error compensation control device and a control method therefor capable of correcting a sensing voltage error using a VDD or Vcore voltage, which is a supply voltage of an MCU, to reduce a sensing error even when an error occurs in an ADC reference voltage.

Here, an object achieved by the present embodiment is not limited to the object as described above, and there may be other objects.

As a technical means for achieving the object, an ADC error compensation control device according to an embodiment of the present invention includes an ADC module configured to calculate a first result value using a sensed input voltage $V_{in}$ and an input reference voltage $V_{ref}$ and calculate a second result value using an input MCU supply voltage and the input reference voltage $V_{ref}$, an error compensation unit configured to calculate an error compensation value on the basis of the second result value calculated by the ADC module, the MCU supply voltage, and a steady state value of the reference voltage $V_{ref}$, and a logic unit configured to calculate a real value on the basis of the first result value and the error compensation value.

Further, as a technical means for achieving the above-described object according to the present invention, an ADC error compensation control method according to an embodiment of the present invention includes a first step of calculating, by an ADC module, a first result value using a sensed input voltage $V_{in}$ and an input reference voltage $V_{ref}$ and calculating a second result value using an input MCU supply voltage and the input reference voltage $V_{ref}$, a second step of calculating, by an error compensation unit, an error compensation value on the basis of the calculated second result value, the MCU supply voltage, and a steady state value of the reference voltage $V_{ref}$, and a third step of calculating, by a logic unit, a real value on the basis of the first result value and the error compensation value.

Advantageous Effects

According to any one of the problem solving means of the present invention described above, it is possible to correct a sensing voltage error using a VDD or Vcore voltage, which is a supply voltage of an MCU, to reduce a sensing error even when an error occurs in an ADC reference voltage.

DETAILED DESCRIPTION

Hereinafter, embodiments of the present invention will be described in detail so that those skilled in the art can easily implement the present invention with reference to the accompanying drawings. However, the present invention may be embodied in several different forms and is not limited to the embodiments described herein. In order to clearly describe the present invention, parts irrelevant to the description in the drawings are omitted, and similar parts are denoted by similar reference signs throughout the specification. Further, in the description that is given with reference to the drawings, even when configurations are indicated by the same names, reference signs thereof may vary depending on the drawings, and reference signs are only described for convenience of description, and concepts, characteristics, functions, or effects of respective configurations are not to be construed as limiting according to the reference signs.

Throughout the specification, when a part is said to be "connected" to another part, this includes not only a case in which the part is "directly connected" to the other part, but also a case in which the part is "electrically connected" to the other part with another element interposed therebetween. Further, when a part is said to "include" a certain component, this means that the part may further include other components, not excluding the other components unless otherwise stated, and it should be understood that the presence or addition of one or more other features, numbers, steps, operations, components, parts, or combinations thereof is not excluded in advance.

In the present specification, a 'unit' or a 'module' includes a unit realized by hardware or software or a unit realized by using both of the hardware and the software, and one unit is realized by using two or more pieces of hardware may be, or two or more units may be realized by one piece of hardware.

Figure 1:
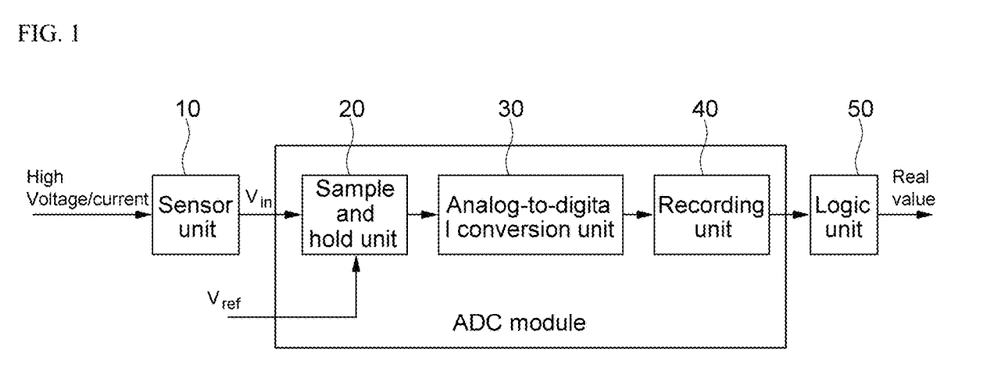
FIG. 1 is a diagram schematically illustrating a configuration of an ADC error compensation control device according to a first embodiment of the present invention.
Figure 2:
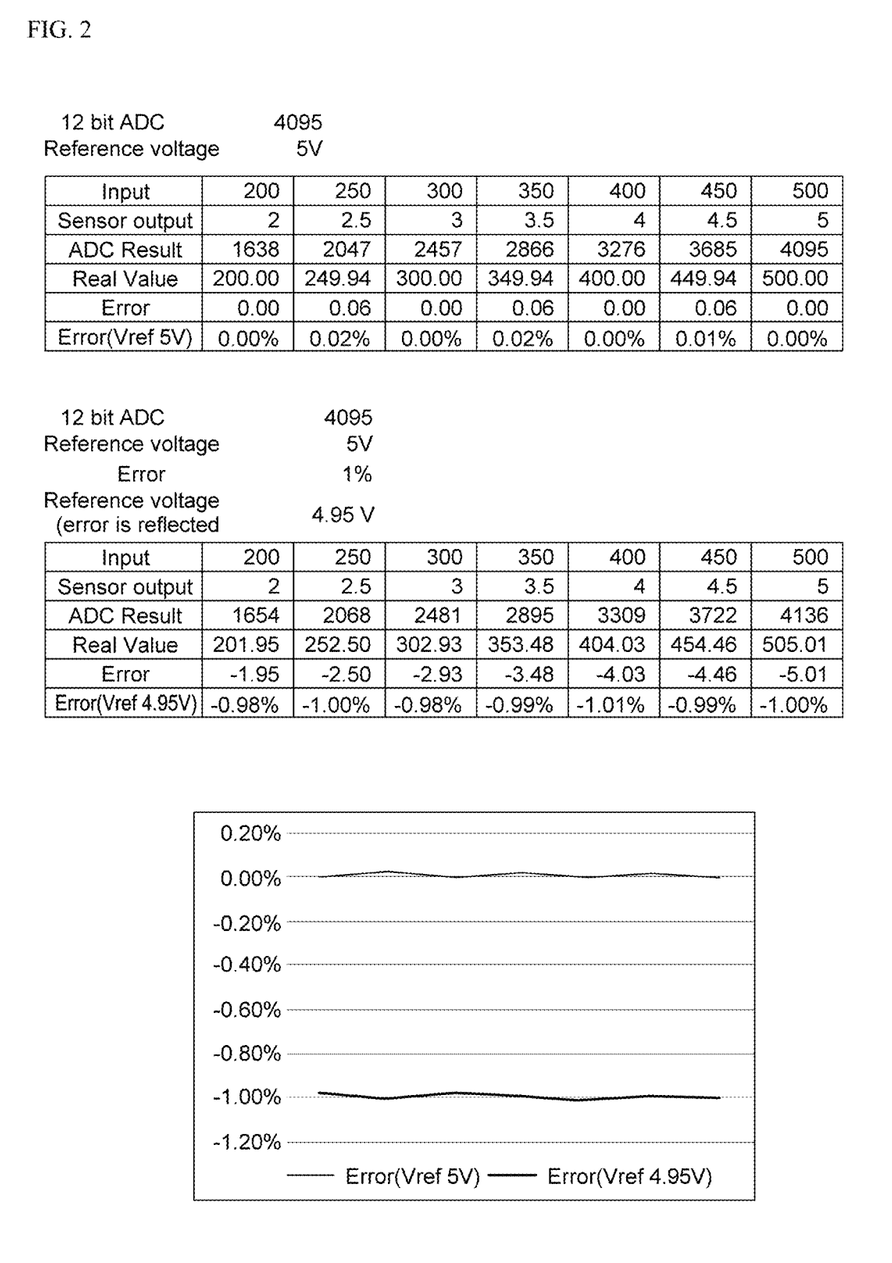
FIG. 2 is a diagram illustrating a graph of a sensing error rate when an error occurs in a reference voltage due to the configuration of FIG. 1.

FIG. 1 is a diagram schematically illustrating a configuration of an ADC error compensation control device according to a first embodiment of the present invention, and FIG. 2 is a diagram illustrating a graph of a sensing error rate when an error occurs in a reference voltage due to the configuration of FIG. 1.

As illustrated in FIG. 1, an SAR type ADC basically has a structure in which a final digital result is derived through a plurality of circular comparisons after one sampling, and includes a sensor unit 10, a sample and hold unit 20, an analog-to-digital conversion unit 30, a recording unit 40, and a logic unit 50.

The sensor unit 10 senses a voltage or current, and the sample and hold unit 20 samples an input analog signal at each preset sampling period and compares the sensed current/voltage value with a reference voltage.

The analog-to-digital conversion unit 30 compares differences between analog voltage values to create a digital value. The recording unit 40 records a comparison result value of the analog-to-digital conversion unit 30, and the logic unit 50 receives the comparison result value recorded in and fed back from the recording unit 40, and connects a required reference voltage to the sample and hold unit 20.

In the SAR type ADC, the ADC is performed using Equation 1 below in the logic unit 50, conversion into a physical value is performed through a real value conversion logic as shown in Equation 2 below, and the physical value is used for control.

$$\frac{V_{in}}{V_{ref}} \times ADC \text{ Bit} = ADC \text{ Result} \quad \text{[Equation 1]}$$

Here, $V_{ref}$ is the reference voltage, $V_{in}$ is an input voltage, the ADC bit is the number of ADC bits, and the ADC Result is an error value calculated by using the reference voltage.

$$\frac{ADC \text{ Result}}{ADC \text{ Bit}} \times \text{Real value conversion factor} = \text{Real value} \quad \text{[Equation 2]}$$

The ADC bit is the number of ADC bits, the ADC Result is the error value calculated by using the reference voltage, the real value conversion factor is a real value conversion factor, and the real value is a real value.

When an error occurs in the $V_{ref}$ value as in Equation 1 above, the error influences the real value finally calculated using Equation 2, and a sensing error may occur.

As illustrated in FIG. 2, an example in which a sensing error is calculated when the error occurs in the reference voltage is shown. For example, in this case, the reference voltage is 5 V, the ADC bit is 12 bits, a sensing range is 0 to 500 V, and the input voltage is 400 V, and it can be seen that an error occurs when a sensing value is calculated using the reference voltage including the error.

In order to more accurately compensate for the error in the first embodiment, a second embodiment of the present invention can be proposed as follows.

Figure 3:
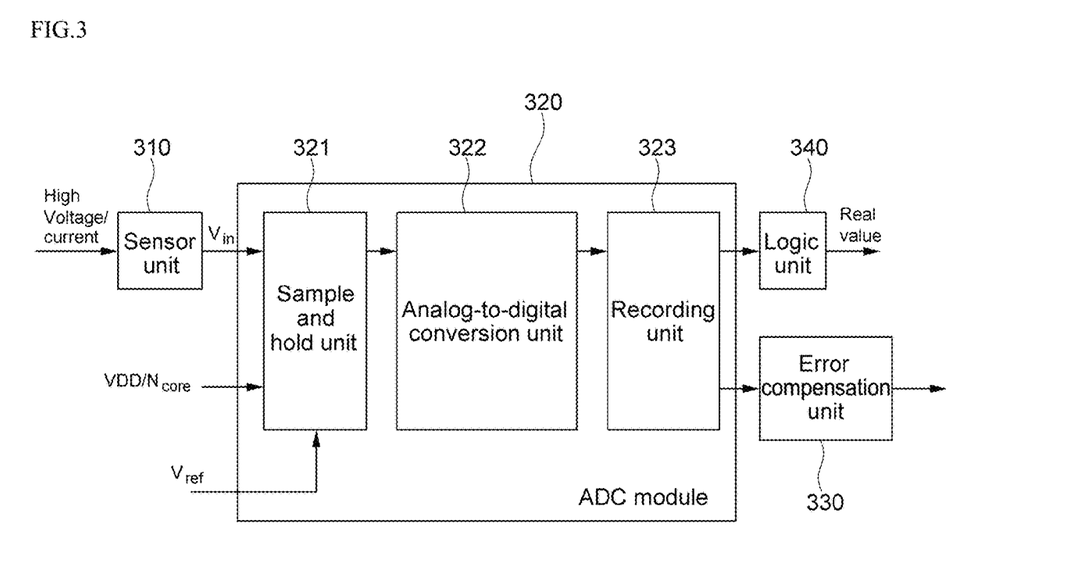
FIG. 3 is a diagram schematically illustrating a configuration of an ADC error compensation control device according to a second embodiment of the present invention.
Figure 4:
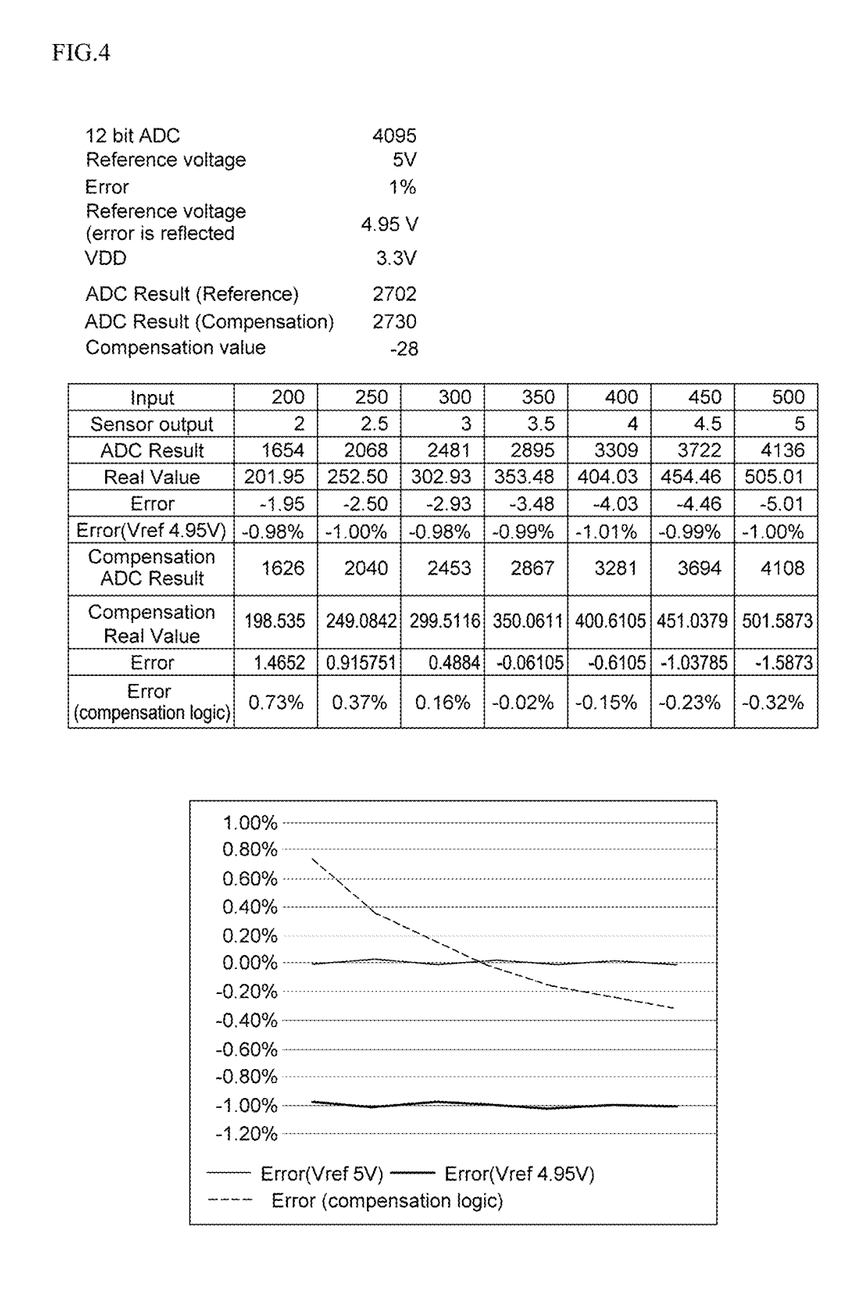
FIG. 4 is a diagram illustrating a graph showing that an error rate is reduced by the configuration of FIG. 3.

FIG. 3 is a diagram schematically illustrating a configuration of an ADC error compensation control device according to a second embodiment of the present invention, and FIG. 4 is a diagram illustrating a graph showing that an error rate is reduced by the configuration of FIG. 3.

As illustrated in FIG. 3, an ADC error compensation control device 300 according to the present invention includes a sensor unit 310, an ADC module 320, an error compensation unit 330, and a logic unit 340. The ADC module 320 may include a sample and hold unit 321, an analog-to-digital conversion unit 322, and a recording unit 323.

The sensor unit 310 senses an input voltage and current, and outputs a sensed input voltage $V_{in}$ to the ADC module 320.

The sample and hold unit 321 of the ADC module 320 may include a comparator element (not illustrated), and uses the input voltage $V_{in}$ sensed by the sensor unit 310 and an input reference voltage $V_{ref}$ to calculate a first result value (ADC result), and uses an input MCU supply voltage and the input reference voltage $V_{ref}$ to calculate a second result value (ADC Result$_{VDD}$).

More specifically, the sample and hold unit 321 samples and holds an applied analog signal $V_{in}$ at a predetermined sampling period, receives the input voltage $V_{in}$ from the sensor unit 310, receives the reference voltage $V_{ref}$ provided by a reference voltage providing unit (not illustrated), and receives a VDD or Vcore voltage, which is the MCU supply voltage.

Here, for the MCU supply voltage, a VDD, a Vcore, and the like are required, and in order to supply such a voltage, an external voltage is applied or an internal voltage of the MCU is generated, and is supplied to the MCU. In this case, the sample and hold unit 321 is supplied with a constant voltage of 3.3 V as a VDD or Vcore voltage, which is the MCU supply voltage. That is, a voltage of the MCU is used as an ADC voltage through a regulator such as an LDO that can generate the constant voltage.

The sample and hold unit 321 calculates a sensing error value (ADC Result), which is the first result value, using the sensed input voltage $V_{in}$ and the reference voltage $V_{ref}$, as shown in Equation 1 above.

Further, the sample and hold unit 321 uses the MCU supply voltage and the reference voltage $V_{ref}$ to calculate the ADC value (ADC Result$_{VDD}$) for VDD that is the second result value using Equation 3 below. That is, a ratio of the MCU supply voltage and the reference voltage is multiplied by the number of ADC bits to obtain an error value calculated by using the MCU supply voltage of the ADC module.

$$\frac{V_{DD}(\text{or } V_{core})}{V_{ref}} \times ADC \text{ Bit} = ADC \text{ Result}_{VDD} \quad \text{[Equation 3]}$$

Here, $V_{ref}$ is the reference voltage, VDD or Vcore is the MCU supply voltage, the ADC bit is the number of ADC bits, and the ADC Result$_{VDD}$ is an error value calculated by using the MCU supply voltage.

The analog-to-digital converter 322 converts analog signals of the first result value (ADC Result) and the second result value (ADC Result$_{VDD}$) calculated by the sample and hold unit 321 into digital signals.

More specifically, the analog-to-digital conversion unit 322 is a circuit element for comparing the input signal sampled from the analog signal with a predetermined reference voltage to sequentially determine bit values corresponding to the applied analog signal from a most significant bit (MSB) to a least significant bit (LSB), and outputting a digital signal (Dout) corresponding to the applied analog signal, and since this is obvious to those skilled in the art in relation to a sequential-approximation analog-to-digital converter (successive-approximation ADC), description of the analog-to-digital conversion unit will be omitted.

The recording unit 323 temporarily stores a digital output value obtained by conversion in the analog-to-digital conversion unit.

More specifically, a SAR type ADC using an SR latch or a SAR type ADC using a D-FF may be applied to the recording unit 323.

When the SR latch is used as the recording unit 323, the SR latch has the advantage that the SR latch can record data more reliably than the D-FF because data is recorded with a D-to-Q delay without an additional clock when an output of the recording unit 323 comes out.

Further, when the D-FF is used as the recording unit 323, there is a burden of additional generation of a clock to record the output of the recording unit 323, and a setup time and a hold time for correctly recording data in the D-FF may be required. Since the hold time causes a rising edge to precede a falling edge and has the same amount in all storage processes, the hold time should be designed to be wider than a minimum condition for safety.

The error compensation unit 330 calculates an error compensation value (ADC Correction value) on the basis of the second result value (ADC Result$_{VDD}$) calculated by the ADC module 320, the MCU supply voltage, and a steady state value of the reference voltage $V_{ref}$.

More specifically, the error compensation unit 330 calculates an error compensation value using Equation 4 below. That is, the error compensation unit 330 calculates the error value calculated by using the MCU supply voltage from the steady state value calculated by using the MCU supply voltage to obtain ab ADC error compensation value.

$$ADC_{VDD\_Normal} - ADC\ Result_{VDD} = ADC\ Correction\ Value \quad \text{[Equation 4]}$$

Here, ADC$_{VDD\_Normal}$ is the steady state value calculated by using the MCU supply voltage, ADC Result$_{VDD}$ is the error value calculated by using the MCU supply voltage, and the ADC Correction Value is the ADC error compensation value.

The logic unit 340 calculates (converts) a real value on the basis of the first result value (ADC Result) and the error compensation value (ADC Correction value).

More specifically, the logic unit 340 calculates the real value using Equation 5 below. That is, the logic unit 340 multiplies a ratio of a result obtained by adding the ADC error compensation value to the error value calculated by using the reference voltage and the number of ADC bits by a real value conversion coefficient to obtain the real value.

$$\frac{ADC\ \text{Result} + ADC\ \text{Correction Value}}{ADC\ \text{Bit}} \times \quad \text{[Equation 5]}$$

$$\text{Real value conversion factor} = \text{Real value}$$

Here, the ADC Result is the error value calculated by using the reference voltage, the ADC Bit is the number of ADC bits, the ADC Correction Value is the ADC error compensation value, the Real value conversion factor is the real value conversion factor, and the Real value is a real value.

In other words, since the ADC result value of 3.3 V when the reference voltage is normal is known, AD conversion is performed on the VDD or Vcore voltage as shown in Equation 3 above for calculation of a reference voltage compensation value, and then, for a difference from the $V_{ref}$ conversion value in a normal case, the error compensation value of Equation 4 is converted into a physical value through a real value conversion logic as in Equation 5 and is used for system control.

For example, when an error occurs in the reference voltage, the sensing error is calculated by reflecting the compensation logic described above, it is assumed that the reference voltage is 5 V, the ADC bits are 12 bits, the sensing range is 0 to 500 V, and the input voltage is 400 V, and calculation can be performed by sequentially applying Equations 3, 4, and 5 as follows.

Application Example $$\frac{V_{DD}(or\ V_{core})}{V_{ref}} \times ADC\ \text{Bit} = ADC\ \text{Result}_{VDD} = \frac{3.3\ V}{4.95\ V} \times 4095 = 2730$$

$$ADC_{VDD\_Normal} = \frac{3.3\ V}{5\ V} \times 4095 = 2702$$

$$ADC\ \text{Correction Value} =$$

$$ADC_{VDD\_Normal} - ADC\ \text{Result}_{VDD} = 2702 - 2730 = -28$$

$$\frac{ADC\ \text{Result} + ADC\ \text{Correction Value}}{ADC\ \text{Bit}} \times \text{Real value conversion factor} =$$

$$\text{Real value} = \frac{3309^{1)} - 28}{4095} \times 500\ V = 400.61\ V$$

Here, 1) is calculated as $$\frac{V_{in}}{V_{ref}} \times ADC\ \text{Bit} = ADC\ \text{Result} = \frac{4\ V(@400\ V)}{4.95\ V} \times 4095 = 3309.$$

It can be seen that a result before application of the compensation logic is calculated as follows by applying Equation 2 described above.

Application Example

3309/4095×500 V=404.03 V

Therefore, it can be seen that a difference from a real sensed value is reduced since the result before the application of the compensation logic is calculated as about 401 V, whereas the result after the application of the compensation logic is calculated as about 401 V.

As illustrated in FIG. 4, it can be seen that the error is reduced as shown in the graph when the above-described compensation logic is applied to 200 to 500 V.

Figure 5:
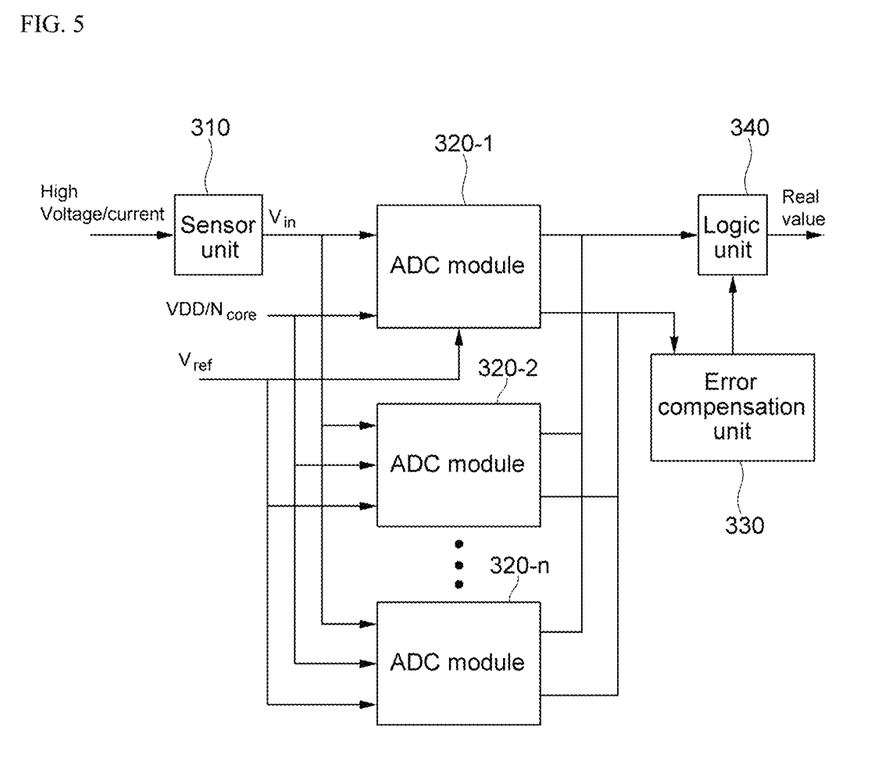
FIG. 5 is a diagram schematically illustrating that an ADC module includes a plurality of channels in the ADC error compensation control device of the present invention.

Meanwhile, FIG. 5 is a diagram schematically illustrating that the ADC module includes a plurality of channels in the ADC error compensation control device of the present invention.

As illustrated in FIG. 5, the ADC module 320 may include at least a plurality of channels, and may be used as the plurality of channels to operate at a higher conversion rate than a single-channel SAR type ADC.

That is, the ADC module 320 may include a plurality of channels that sequentially output digital signals corresponding to analog signals by performing digital conversion on the basis of an input signal obtained by sampling an analog signal at each preset sampling period.

Here, sequential sampling through time interleaving, for example, can be understood as meaning a series of sequential sample and hold operations according to a predetermined order among a plurality of channels, such as performing sampling using a first channel among a plurality of channels and then performing sampling using a second channel among a plurality of channels, and performing the sampling using the second channel and then performing sampling using a third channel.

Even when the ADC module includes a plurality of channels, it is possible to correct a sensing voltage error using a VDD or Vcore voltage, which is a supply voltage of the MCU of the error compensation logic of FIG. 3, thereby reducing a sensing error even when an error occurs in an ADC reference voltage.

Figure 6:
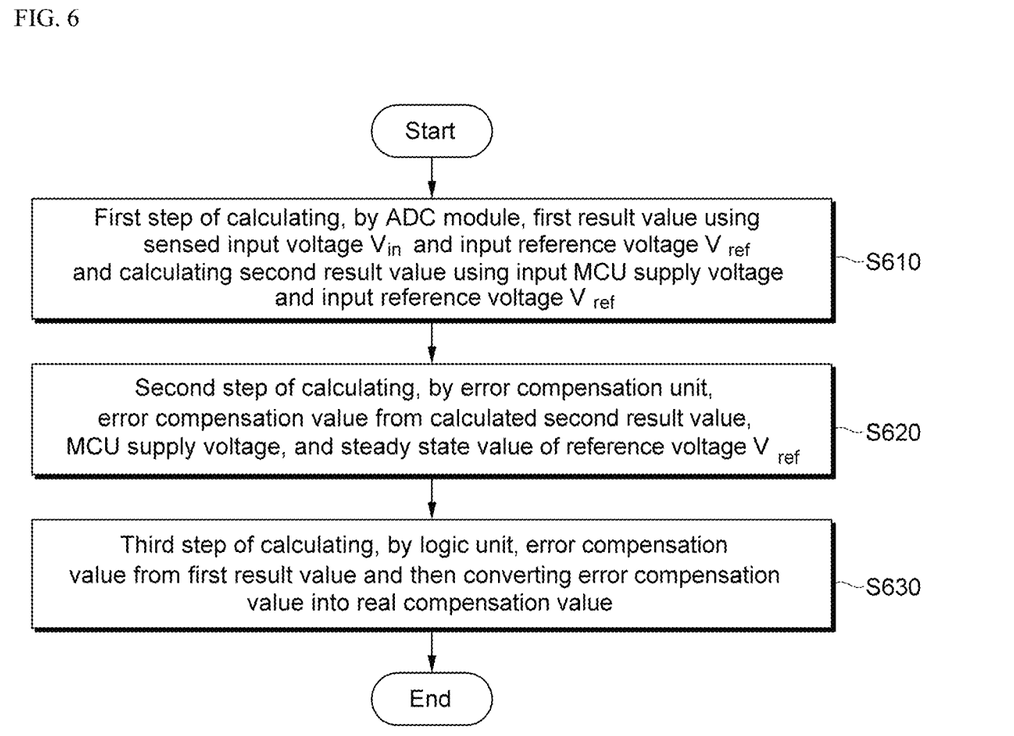
FIG. 6 is a schematic flowchart of an ADC error compensation control method according to an embodiment of the present invention.

Further, FIG. 6 is a schematic flowchart of an ADC error compensation control method according to an embodiment of the present invention. Here, description of overlapping parts between detailed description of respective steps of the ADC error compensation control method and the description of FIG. 3 described above will be omitted with reference to the description of FIG. 3.

First, as illustrated in FIG. 6, the ADC error compensation control method according to an embodiment of the present invention includes a first step (S610) of calculating, by the ADC module, the first result value (ADC Result) using the sensed input voltage $V_{in}$ and the input reference voltage $V_{ref}$ and calculating the second result value (ADC Result$_{VDD}$) using the input MCU supply voltage and the input reference voltage $V_{ref}$.

More specifically, the first step (S610) may include a step of calculating, by the sample and hold unit, the first result value using the sensed input voltage $V_{in}$ and the reference voltage $V_{ref}$, and calculating the second result value using the MCU supply voltage and the reference voltage $V_{ref}$, a step of converting, by the analog-to-digital conversion unit, analog signals of the calculated first result value and the calculated second result value into digital signals, and a step of recording, by the recording unit, the converted digital signal.

Here, the first step (S610) includes calculating an ADC value (ADC Result$_{VDD}$) for VDD using Equation 3 described above. That is, the ratio of the MCU supply voltage and the reference voltage is multiplied by the number of ADC bits to obtain the error value calculated by using the MCU supply voltage of the ADC module.

A second step (S620) of calculating, by the error compensation unit, the error compensation value from the calculated second result value (ADC Result$_{VDD}$), the MCU supply voltage, and the steady state value of the reference voltage $V_{ref}$ is performed.

Here, in the second step (S620), an error compensation value is calculated using Equation 4 described above. That is, the error value calculated by using the MCU supply voltage is calculated from the steady state value calculated by using the MCU supply voltage so that the ADC error compensation value is obtained.

Next, a third step (S630) of calculating, by the logic unit, the error compensation value from the first result value and converting the error compensation value into a real value is performed.

Here, in the third step (S630), the real value is calculated using Equation 5 described above. That is, a ratio of a result obtained by adding the ADC error compensation value to the error value calculated by using the reference voltage and the number of ADC bits is multiplied by a real value conversion coefficient to obtain the real value.

The above-described description of the present invention is for illustrative purposes, and it will be understood by those skilled in the art that the present invention can be easily modified into other specific forms without changing the technical spirit or essential characteristics of the present invention. Therefore, the embodiments described above should be understood as being illustrative in all respects and not limiting. For example, each component described as a single type may be implemented in a distributed manner, and similarly, components described as being distributed may be implemented in a combined form.

The scope of the present invention is indicated by the claims to be described later rather than the detailed description, and all changes or modifications derived from the meaning and scope of the claims and equivalent concepts should be construed as being included in the scope of the present invention.

DETAILED DESCRIPTION OF MAIN ELEMENTS

310: sensor unit
320: ADC module
321: sample and hold unit
322: analog-to-digital converter
323: recoding unit
330: error compensation unit
340: logic unit

What is claimed is:

1. An ADC error compensation control device comprising:
   an ADC module configured to calculate a first result value using a sensed input voltage $V_{in}$ and an input reference voltage $V_{ref}$ and calculate a second result value using an input MCU supply voltage and the input reference voltage $V_{ref}$;
   an error compensation unit configured to calculate an error compensation value on the basis of the second result value calculated by the ADC module, the MCU supply voltage, and a steady state value of the reference voltage $V_{ref}$; and
   a logic unit configured to calculate a real value on the basis of the error compensation value from the first result value.

2. The ADC error compensation control device of claim 1, wherein the MCU supply voltage is 3.3 V as a VDD or Vcore voltage.

3. The ADC error compensation control device of claim 1, wherein the ADC module includes:
a sample and hold unit configured to calculate the first result value using the sensed input voltage $V_{in}$ and the reference voltage $V_{ref}$, and calculate the second result value using the MCU supply voltage and the reference voltage $V_{ref}$;
an analog-to-digital conversion unit configured to convert analog signals of the first result value and the second result value calculated by the sample and hold unit into digital signals; and
a recording unit configured to record the digital signal converted by the analog-to-digital conversion unit.

4. The ADC error compensation control device of claim 1, wherein the ADC module calculates an ADC value for VDD using the following equation $$\frac{V_{DD}(\text{or } V_{core})}{V_{ref}} \times ADC \text{ Bit} = ADC \text{ Result}_{VDD}$$

where $V_{ref}$ is the reference voltage, VDD or Vcore is the MCU supply voltage, the ADC bit is the number of ADC bits, and the ADC Result$_{VDD}$ is an error value calculated by using the MCU supply voltage.

5. The ADC error compensation control device of claim 1, wherein the error compensation unit calculates the error compensation value using the following equation ADC$_{VDD\_Normal}$−ADC Result$_{VDD}$=ADC Correction Value where ADC$_{VDD\_Normal}$ is the steady state value calculated by using the MCU supply voltage, ADC Result$_{VDD}$ is the error value calculated by using the MCU supply voltage, and the ADC Correction Value is the ADC error compensation value.

6. The ADC error compensation control device of claim 1, wherein the logic unit calculates the real value using the following equation $$\frac{ADC \text{ Result} + ADC \text{ Correction Value}}{ADC \text{ Bit}} \times$$
Real value conversion factor = Real value where the ADC Result is an error value calculated by using a reference voltage, the ADC Bit is the number of ADC bits, the ADC Correction Value is an ADC error compensation value, the Real value conversion factor is the real value conversion factor, and the Real value is a real value.

7. The ADC error compensation control device of claim 1, further comprising:
a sensor unit configured to sense a current/voltage input to the ADC module and outputs the sensed input voltage $V_{in}$.

8. The ADC error compensation control device of claim 1, wherein the ADC module includes at least a plurality of channels.

9. An ADC error compensation control method comprising:
a first step of calculating, by an ADC module, a first result value using a sensed input voltage $V_{in}$ and an input reference voltage $V_{ref}$, and calculating a second result value using an input MCU supply voltage and the input reference voltage $V_{ref}$;

a second step of calculating, by an error compensation unit, an error compensation value on the basis of the calculated second result value, the MCU supply voltage, and a steady state value of the reference voltage $V_{ref}$; and
a third step of calculating, by a logic unit, a real value on the basis of the first result value and the error compensation value.

10. The ADC error compensation control method of claim 9, wherein the MCU supply voltage is 3.3 V as a VDD or Vcore voltage.

11. The ADC error compensation control method of claim 9, wherein the first step includes:
a step of calculating, by a sample and hold unit, the first result value using the sensed input voltage $V_{in}$ and the reference voltage $V_{ref}$, and calculating the second result value using the MCU supply voltage and the reference voltage $V_{ref}$;
a step of converting, by an analog-to-digital conversion unit, analog signals of the calculated first result value and the calculated second result value into digital signals; and
a step of recording, by a recording unit, the converted digital signal.

12. The ADC error compensation control method of claim 9, wherein the first step includes calculating an ADC value for VDD using the following equation $$\frac{V_{DD}(\text{or } V_{core})}{V_{ref}} \times ADC \text{ Bit} = ADC \text{ Result}_{VDD}$$

where $V_{ref}$ is the reference voltage, VDD or Vcore is the MCU supply voltage, the ADC bit is the number of ADC bits, and the ADC Result$_{VDD}$ is an error value calculated by using the MCU supply voltage.

13. The ADC error compensation control method of claim 9, wherein the second step includes calculating the error compensation value using the following equation ADC$_{VDD\_Normal}$−ADC Result$_{VDD}$=ADC Correction Value where ADC$_{VDD\_Normal}$ is the steady state value calculated by using the MCU supply voltage, ADC Result$_{VDD}$ is the error value calculated by using the MCU supply voltage, and the ADC Correction Value is the ADC error compensation value.

14. The ADC error compensation control method of claim 9, wherein the third step includes calculating the real value using the following equation $$\frac{ADC \text{ Result} + ADC \text{ Correction Value}}{ADC \text{ Bit}} \times$$
Real value conversion factor = Real value where the ADC Result is an error value calculated by using a reference voltage, the ADC Bit is the number of ADC bits, the ADC Correction Value is an ADC error compensation value, the Real value conversion factor is the real value conversion factor, and the Real value is a real value.

15. The ADC error compensation control method of claim 9, further comprising:
   sensing, by a sensor unit, a current/voltage input to the ADC module and outputting the sensed input voltage $V_{in}$.

16. The ADC error compensation control method of claim 9, wherein the ADC module includes at least a plurality of channels.

* * * * *